United States Patent
Krishna et al.

(10) Patent No.: US 7,271,405 B2
(45) Date of Patent: Sep. 18, 2007

(54) INTERSUBBAND DETECTOR WITH AVALANCHE MULTIPLIER REGION

(75) Inventors: Sanjay Krishna, Albuquerque, NM (US); John P. R David, Sheffield (GB); Majeed M Hayat, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 10/965,702

(22) Filed: Oct. 13, 2004

(65) Prior Publication Data
US 2005/0211996 A1     Sep. 29, 2005

Related U.S. Application Data

(60) Provisional application No. 60/510,986, filed on Oct. 14, 2003.

(51) Int. Cl.
*H01L 31/105*     (2006.01)

(52) U.S. Cl. .................. 257/21; 257/17; 257/186; 257/E31.064

(58) Field of Classification Search .......... 257/21, 257/17, 180
See application file for complete search history.

(56) References Cited

U.S. PATENT DOCUMENTS

| | | | |
|---|---|---|---|
| 5,936,266 A * | 8/1999 | Holonyak et al. | 257/106 |
| 6,229,152 B1 * | 5/2001 | Dries et al. | 257/17 |
| 6,888,170 B2 * | 5/2005 | Schaff et al. | 257/98 |
| 2003/0047752 A1 * | 3/2003 | Campbell et al. | 257/186 |
| 2003/0173578 A1 | 9/2003 | Schaff et al. | |

OTHER PUBLICATIONS

Notification of Transmittal of the International Search Report and the Written Opinion, PCT/US04/34152, Nov. 8, 2005, 8 pages.

* cited by examiner

*Primary Examiner*—Jerome Jackson
(74) *Attorney, Agent, or Firm*—MH2 Technology Law Group, LLP.

(57) ABSTRACT

A photodetector for use at wavelengths of 2 μm and longer has an intersubband absorption region to provide absorption at wavelengths beyond 2 μm, integrated with an avalanche multiplier region to provide low-noise gain. In one particular design, the intersubband absorption region is a quantum-confined absorption region (e.g., based on quantum wells and/or quantum dots).

2 Claims, 3 Drawing Sheets

INTERSUBBAND DETECTOR WITH AVALANCHE MULTIPLIER REGION

CROSS-REFERENCE TO RELATED APPLICATION

This application claims priority under 35 U.S.C. § 119(e) to U.S. Provisional Patent Application Ser. No. 60/510,986, "Intersubband Quantum Dot Detectors with Avalanche Photodiodes," filed Oct. 14, 2003. The subject matter of the foregoing is incorporated herein by reference in its entirety.

BACKGROUND OF THE INVENTION

1. Field of the Invention

This invention relates to photodetectors and, more particularly, to photodetectors where absorption is based on an intersubband transition and gain is provided by an avalanche multiplier region.

2. Description of the Related Art

With the recent increased interest in mid-wavelength infrared (MWIR) and long-wavelength infrared (LWIR) optoelectronic devices and applications, much attention has been directed to semiconductor optoelectronic devices, such as lasers, light emitting diodes (LEDs), photodetectors and the like. Particular concern has been directed to the area of detectors that operate at wavelengths between approximately 2 µm and 30 µm. Such devices are an important component in optical systems that can be used for applications including remote sensing, LADAR, detection of chemical warfare agents, intelligence surveillance and reconnaissance (ISR), enemy missile tracking and infrared countermeasures (IRCM).

Currently, high-performance photonic detectors in this wavelength range typically must be cooled to cryogenic temperatures (4-100K) to overcome deleterious effects arising due to thermionic emission. The cooling system itself can be complicated, requiring multi-stage Sterling coolers, and can comprise up to 60% of the total cost of an infrared camera based upon infrared photodetectors. These cameras have a variety of applications ranging from thermal imaging and night vision systems to effluent detection and medical diagnostics. If the operating temperature of a detector could be increased from cryogenic temperatures to temperatures achievable by the relatively inexpensive Peltier coolers (150-250K), this would lead to a significant reduction in the cost and complexity of infrared sensors and imaging systems.

State of the art MWIR and LWIR detectors are usually based on narrow bandgap mercury cadmium telluride (MCT) material, which generally offers the highest single pixel performance at a given temperature. However, non-uniformity issues associated with native defects have limited the progress of MCT-based focal plane arrays. Presently, high performance LWIR cameras used for military applications are grown on CdZnTe wafers that are expensive, can exhibit high levels of defects that subsequently degrade device performance, and are incompatible with the electronic circuitry.

One alternative to cryogenically cooled photonic detectors is bolometer-based detectors. However, this is still an emerging technology that suffers from poor performance relative to cooled detectors.

Another alternative that can be used to detect light in the >2 µm region is a quantum dot infrared photodetector (QDIP), whose operation is based on intersubband transitions of electrons. QDIPs offer many advantages. They can be operated in normal incidence. They can be based on mature GaAs-based technology. The multi-color response can be tailored from 3-30 µm. They typically have low dark current. They can also have large quantum confined Stark effect, which can be exploited to realize hyperspectral sensors. However, one of the problems facing QDIPs is their low quantum efficiency, which leads to a lower detectivity and responsivity. This, in turn, typically limits their operating temperature to about 70-80K.

In addition, the infrared wavelength region beyond approximately 2 µm is a rich area of spectroscopic research, allowing the detection of complex molecules, based on absorption arising from vibrational and rotational modes of the molecules. However, studies in this region are hampered by the absence of sufficiently sensitive detectors. Photon-counting systems are regarded as the ultimate in photon-sensing techniques from a sensitivity perspective, and have applications for sensing ultralow-level images and signals in many scientific and engineering fields stretching from microscopy and medical imaging to astronomy and astrophysics, where the photon flux is very limited. Presently, no single photon detectors are available for wavelengths beyond 2 µm.

Thus, there is a need for MWIR and longer wavelength infrared detectors that have good performance with only Peltier cooling or less. There is also a need for photon-counting and other ultra sensitive detectors at these wavelengths.

SUMMARY OF THE INVENTION

The above problems and others are at least partially solved and the above purposes and others realized by providing a photodetector having an intersubband absorption region (e.g., an absorption region based on quantum dots) to provide absorption at wavelengths beyond 2 µm, integrated with an avalanche multiplier region to provide low-noise gain. In one particular design, the intersubband absorption region is a quantum-confined absorption region (e.g., based on quantum wells and/or quantum dots).

In another aspect, a photodetector includes an n-i-n structure integrated with a p-i-n structure. The n-i-n structure includes the intersubband absorption region and the p-i-n structure includes the avalanche multiplier region. Incident light generates photocarriers in the absorption region, which are swept towards the p-i-n structure by an applied bias. The carriers tunnel their way into the avalanche multiplier region, where the carriers are multiplied in an avalanche process. Electrical contacts are used to apply the correct biases across both the absorption region and the avalanche multiplier region.

In a specific design, the photodetector includes a GaAs substrate and the following regions in order away from the substrate: an avalanche multiplier region, a highly doped p-type region, a first n-type contact region, a quantum-confined absorption region, and a second n-type contact region. Most, if not all, of the regions are based on GaAs. One example of a quantum-confined absorption region is a dot-in-well (DWELL) design, for example InAs dots within $In_yGa_{1-y}As$ wells. Electrical contacts to the substrate and the two contact regions allow for the application of bias voltages across the absorption region and the avalanche multiplier region.

BRIEF DESCRIPTION OF THE DRAWINGS

The foregoing and further and more specific objects and advantages of the invention will become readily apparent to those skilled in the art from the following detailed description taken in conjunction with the drawings in which.

DETAILED DESCRIPTION OF THE PREFERRED EMBODIMENTS

Figure 1:
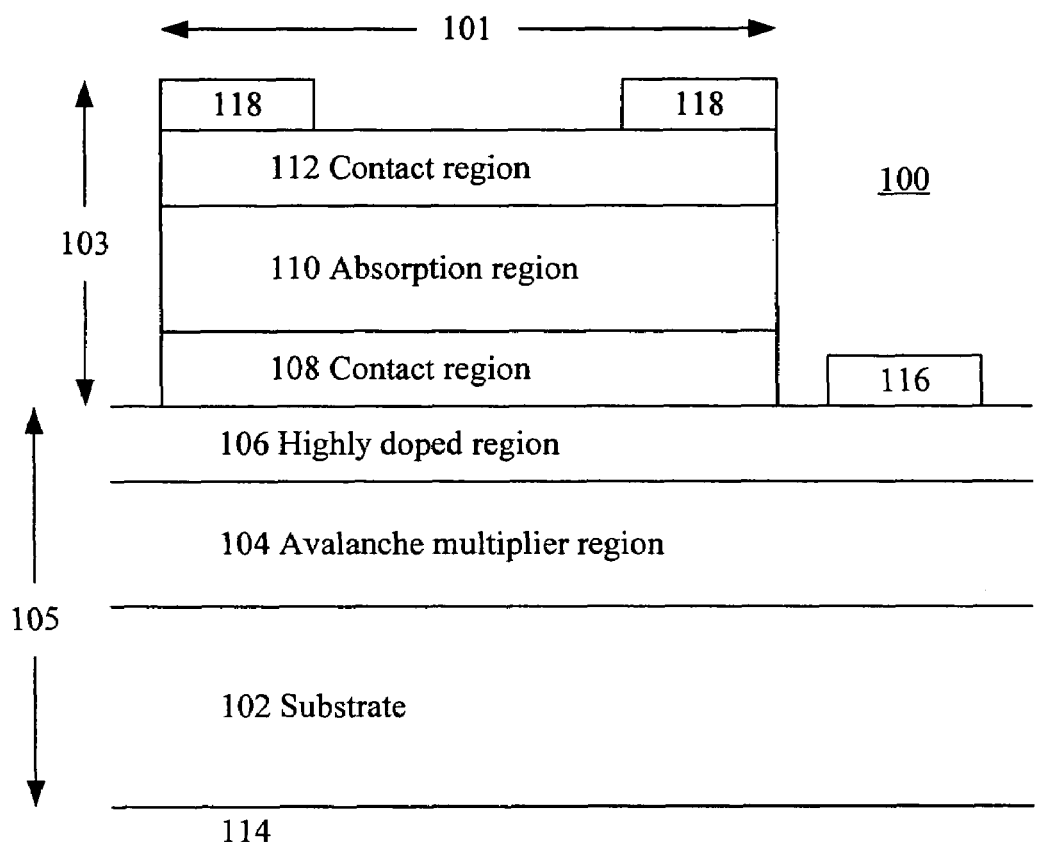
FIG. 1 is a sectional view of a quantum dot avalanche photodetector (QDAP) according to the invention.

FIG. 1 is a sectional view of one example of a quantum dot avalanche photodetector (QDAP) 100 according to the present invention. In this example, QDAP 100 includes a quantum dot absorption region 110 and an avalanche multiplier region 104. The quantum dot absorption region 110 is part of an n-i-n structure 103. The avalanche multiplier region 104 is part of a p-i-n structure 105. These structures are supported on a substrate 102. The QDAP 100 also includes electrical contacts, implemented as ohmic contact regions 114, 116 and 118 and doped regions 106/108 and 112 in this example. These electrical contacts allow voltages to be applied to the absorption region 110 and to the avalanche multiplier region 104.

FIG. 1 will be discussed in the context of a particular embodiment and is simplified for ease of discussion. Thus, it is not intended to be limiting. For example, other embodiments may use some, all or none of the specific regions shown in FIG. 1. The basic structure may be used with certain regions omitted and/or additional regions inserted. The regions are shown in FIG. 1 without lateral shape when, in fact, the lateral shapes of the regions may be different and various regions may or may not be overlapping. The composition of the regions and the number of layers within each region may vary from one design to the next. In the example embodiment used to discuss FIG. 1, each region is shown as a single layer of material for ease of discussion but this it not meant to be a limitation. Other variations will be apparent. For example, various forms of quantum dot absorption region 110, including dots-in well detectors and the like can be integrated in the QDAP. Non-quantum dot and even non-quantum absorption regions 110 can also be used. More complex avalanche multiplier regions 104 than that shown can also be used, for example to improve signal to noise ratio.

In the example embodiment of FIG. 1, the substrate 102 is a Gallium Arsenide (GaAs) substrate. However, substrate 102 can include other materials, for example Indium Phosphide (InP), Indium Arsenide (InAs), Gallium Antimonide (GaSb), Cadmium Zinc Telluride (CdZnTe), Silicon (Si), and epitaxially grown materials (such as a ternary or quaternary semiconductor) to name a few, or the like. In a preferred embodiment, substrate 102 is typically doped n-type, to provide a contact layer. However, substrate 102 can include p-doped material, or undoped material. In the case of undoped material, an additional contact layer preferably is first deposited on substrate 102 prior to further growth. The substrate 102 typically has a lattice constant that reduces defects in materials subsequently grown thereon.

An avalanche multiplier region 104 is positioned on substrate 102 and a highly doped contact region 106 is positioned on avalanche multiplier region 104. The contact region 106 includes doped material with a different conductivity type to substrate 102. In the example of FIG. 1, the avalanche multiplier region 104 is GaAs, the contact region 106 is p-type GaAs and the substrate 102 is n-type GaAs. However, other materials can be also be used for these regions 104, 106, for example other pseudomorphic materials that preferably are lattice-matched to substrate 102. Examples include InGaAs, AlGaAs and the like.

Highly doped contact region 106, avalanche multiplier region 104, and doped substrate 102 form a p-i-n structure 105. In alternate designs, a region other than substrate 102 may form the n part of the p-i-n structure. For example, an additional n-type contact layer may be formed between the substrate 102 and avalanche multiplier region 104, thus forming a p-i-n structure with regions 106 and 104.

A first contact region 108 is positioned on highly doped region 106. This contact region 108 includes doped material with a different conductivity type to highly doped region 106. An intersubband absorption region 110 is positioned on contact region 110 and a second contact region 112 is positioned on that. The two contact regions 108 and 112 are doped with the same conductivity type. In the example of FIG. 1, contact region 108 is n-type GaAs, the intersubband absorption region 110 is a quantum dot region, and the contact region 112 is n-type GaAs. First contact region 108, quantum dot region 110, and second contact region 112 form an n-i-n structure 103.

Figure 2:
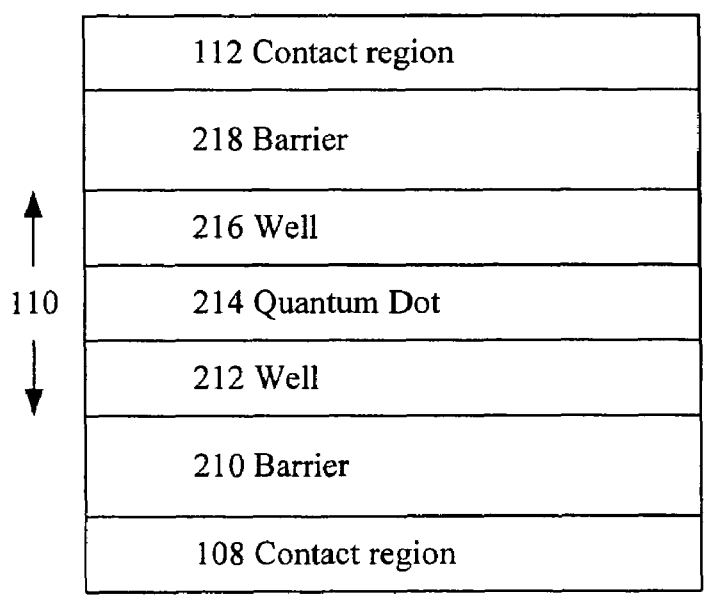
FIG. 2 is a sectional view of a dot-in-well (DWELL) absorption region for the QDAP of FIG. 1.

The quantum dot absorption region 110 includes a self-assembled array of quantum dots embedded in a material with a larger bandgap than the quantum dots, capable of absorbing an infrared wavelength >2 µm. FIG. 2 below shows a preferred implementation of the absorption region 110.

In the preferred embodiment, a mesa 101 is formed by etching through into first contact region 108, as shown. Mesa 101 can be formed using conventional techniques, such as wet etching, dry etching, or the like. Bottom, middle and top ohmic contact regions 114, 116, and 118 are formed by standard semiconductor processing techniques.

FIG. 2 is a sectional view of a quantum dot absorption region 110 suitable for use in the QDAP of FIG. 1. Contact regions 108 and 112 are shown in both FIGS. 1 and 2. The contact region 108 provides a lateral electrical contact and also facilitates current collection.

A first barrier region 210 is positioned on contact region 108. The first barrier region 210 provides a barrier to electron motion for an absorption region 110 subsequently grown thereon. In this example, first barrier region 210 is GaAs, when grown on a GaAs substrate. Other suitable barrier materials can also provide a conduction band offset, including but not limited to $Al_xGa_{1-x}As$, where x may vary from 0% to 100%, and GaAsP, when grown on a GaAs substrate. Other materials are suitable for other substrate types.

The absorption region 110 is then formed by sequential deposition of a first well region 212, a quantum-dot region 214 and a second well region 216. Absorption region 110 is illustrated as consisting of a single set of regions 212, 214 and 216 for simplicity and ease of discussion, and is not intended to limit the scope of the invention. In a preferred embodiment, the absorbing region 110 can include many more regions than are shown in FIG. 2. For example, the basic structure defined by regions 212-216 can be repeated sequentially multiple times to form the absorbing region 110, with each iteration of the basic structure separated from the next by barrier regions. Each iteration of the basic structure may be different in design. For example, the composition and/or thickness could be changed to enhance spectral diversity or signal to noise ratio.

First well region 212 is formed using a material with a lower conduction band edge than barrier region 210. In the example embodiment, first well region 212 is $In_xGa_{1-x}As$, where x is approximately equal to 15%. However, other compositions and other suitable materials may be chosen, depending on the starting substrate and desired band offset.

Quantum dot region 214 is formed using a self-assembled arrangement of quantum dots that is lightly doped with Si to provide 1-2 electrons per dot. The doping is optional. In the design of FIG. 2, the composition of quantum dot region 214 is chosen such that a conduction band edge of quantum dot region 214 is less than that of both first well region 212 and second well region 216. In the example, quantum dot region 214 includes InAs dots, when grown on a GaAs substrate. Other dot materials can also be used. The choice of materials depends in part on the starting substrate and the desired band offset. The geometry of the dots and the density of the dots are controlled by growth conditions. In the example embodiment, the quantum dot region 214 is lightly doped to provide approximately one electron per quantum dot.

Second well region 216 is formed using a material with a lower conduction band edge than barrier region 210 and barrier region 218. In the FIG. 2 example, well region 216 is $In_yGa_{1-y}As$, where y is approximately equal to 15%. Other compositions and other suitable materials may be chosen, depending in part on the starting substrate and desired band offset. The composition and/or thickness of second well region 216 may be chosen to be different from the composition and/or thickness of first well region 212. This would introduce an asymmetry that can lead to spectrally tunable behavior for the absorption region 110.

Barrier region 218 is positioned on second well region 216. Barrier region 218 includes a material capable of providing a barrier to electron motion for absorption region 110. In the FIG. 2 example, barrier region 218 consists of GaAs, when grown on a GaAs substrate, the same as barrier region 210. As with barrier region 210, other materials can provide a suitable conduction band offset, including but not limited to AlGaAs and GaAsP, when grown on a GaAs substrate.

Well regions 212 and 216, surrounded by barrier regions 210 and 218 provide a quantum well. Quantum dot region 214 sits in this quantum well. Absorbing region 110 combined with barrier region 210 provides a quantum potential system wherein the allowed states for electrons in the dots and wells are determined by the compositions and thicknesses of the wells and barriers, together with the composition and geometry of the dots. Intersubband transitions between energy levels in dots, wells and barriers define an infrared absorption spectrum for the absorption region 110. A contact region 112 is positioned on barrier region 218.

The absorption region 110 can be fabricated using conventional means. In a preferred approach, the various regions are deposited using Molecular Beam Epitaxy, Metalorganic Chemical Vapor Deposition, or similar conventional techniques. The conditions used to grow quantum dot region 214 can be used to vary the size, shape and density of the quantum dots using well-known principles. Using conventional techniques, large number of individual devices and/or arrays of devices can be simultaneously fabricated on a substrate. Other materials systems can also be used. For example, an alternate embodiment uses quantum dots made with $In_xGa_yAl_zAs$, quantum wells made with $In_xGa_yAl_zAs$ and barriers using a different composition of $In_xGa_yAl_zAs$.

Referring now to the avalanche multiplier region 104 of FIG. 1, when grown on a GaAs substrate 102, the avalanche multiplier region 104 typically is GaAs. The regions around the avalanche multiplier region 104 can be formed by conventional techniques, including but not limited to processing steps of deposition of layers, ion implantation, and photolithography. The performance of the avalanche multiplier region can be further optimized by using a heterostructure and controlling the composition and thicknesses of the different layers.

Figure 3:
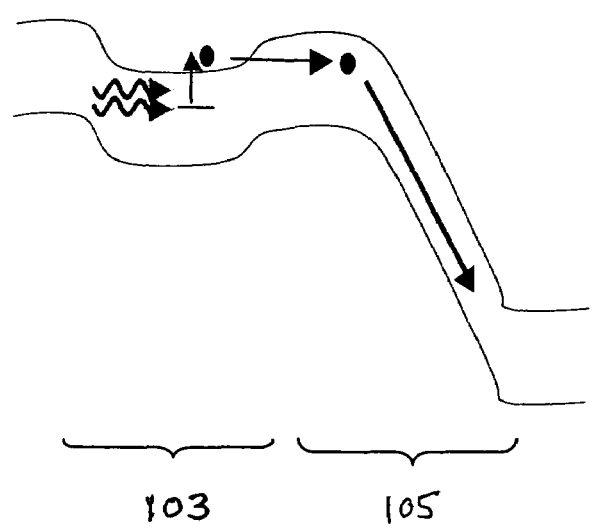
FIG. 3 is a schematic of a band-edge diagram of the QDAP of FIG. 1.

FIG. 3 illustrates the operating principle of QDAP 100. During device operation, n-i-n region 103 and p-i-n region 105 are both operated under a reverse bias. In one approach, bias voltages applied to the top 118, middle 116 and bottom 114 contacts, $V_{top}$, $V_{mid}$ and $V_{bot}$, respectively are chosen such that $V_{top} < V_{mid} < V_{bot}$. Light incident through an aperture in top ohmic contact 118 is absorbed in quantum dot absorption region 110. The applied field sweeps photogenerated carriers from region 110 towards p-i-n region 105.

The thickness and composition of highly doped region 106 is chosen to allow photoexcited electrons to tunnel into the avalanche multiplier region 104. A reverse bias applied to p-i-n structure 105, preferably close to the reverse breakdown voltage, results in gain due to an avalanche multiplication process, resulting in an amplified photocurrent. Electrons that tunnel into avalanche multiplier region 104 are accelerated by the high applied field, resulting in ionizing collisions with the semiconductor lattice. Secondary carriers are produced, thus increasing current. This process is known as impact ionization and leads to carrier multiplication and hence gain. Excess noise in the avalanche multiplier region 104 is significantly lower than for a conventional APD, since only electrons are injected into the avalanche multiplier region 104 and holes play no part in the avalanche process.

Note that the quantum dot absorption region 110 is located within an n-i-n structure 103, whereas the avalanche multiplier region 104 is located within a p-i-n structure 105 that is operated under a reverse bias close to a breakdown voltage. The design of the device addresses the interaction between the n-type contact region 108 and the p-type contact region 106. This interface between n-i-n region 103 and p-i-n region 105 is important in determining the operation of QDAP 100. Doping, concentration and a composition of highly doped region 106 is chosen to enable tunneling.

Figure 4:
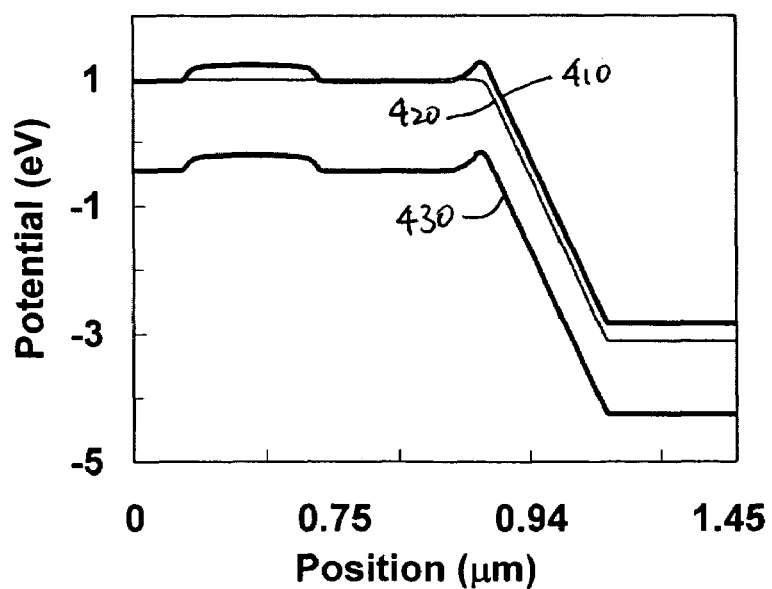
FIG. 4 is a graph of a simulation of a band structure of a QDAP.

FIG. 4 is a simulation of a band structure of a QDAP according to the invention. Simulation was carried out using commercially available simulation software (MEDICI). Curve 410 shows the conduction band, curve 420 the n Quasi-Fermi level and curve 430 the valence band. Quantum dots were simulated by N-traps with an activation energy of 300 meV (in accordance with the position of a ground state of a quantum dot). In particular, band structure and transport properties of the QDAP were simulated according to design parameters including a doping level and a thickness of highly doped region 106. FIG. 4 shows a calculated band structure of QDAP 100 along with the electronic quasi-Fermi levels for $V_{top}=-1V$, $V_{mid}=0V$ and $V_{bot}=-5V$ with a doping level of $p=5\times10^{18}$ $cm^{-3}$. Note that the calculated band structure is in good agreement with the schematic of FIG. 3.

Figure 5:
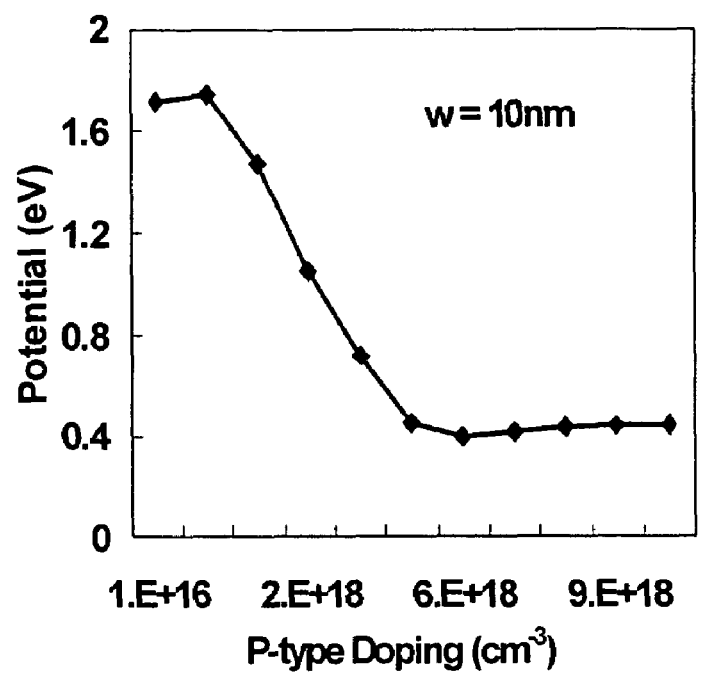
FIG. 5 is a graph showing a variation of a barrier height of a highly doped region as a function of doping level, for a fixed width of 10 nm in a QDAP.

FIG. 5 graphs a variation of a barrier height of highly doped region 106 as a function of doping level, for a fixed width of 10 nm. As the doping in the p-type region is increased, the peak of the barrier moves from avalanche multiplier (intrinsic) region 104 of the p-i-n structure 105 to the highly doped region 106, since a voltage drop across the highly doped region 106 is small. For a p-type doping in the range of $5 \times 10^{18}$-$10 \times 10^{18}$ cm$^{-3}$, a potential barrier is about 400 meV.

Figure 6:
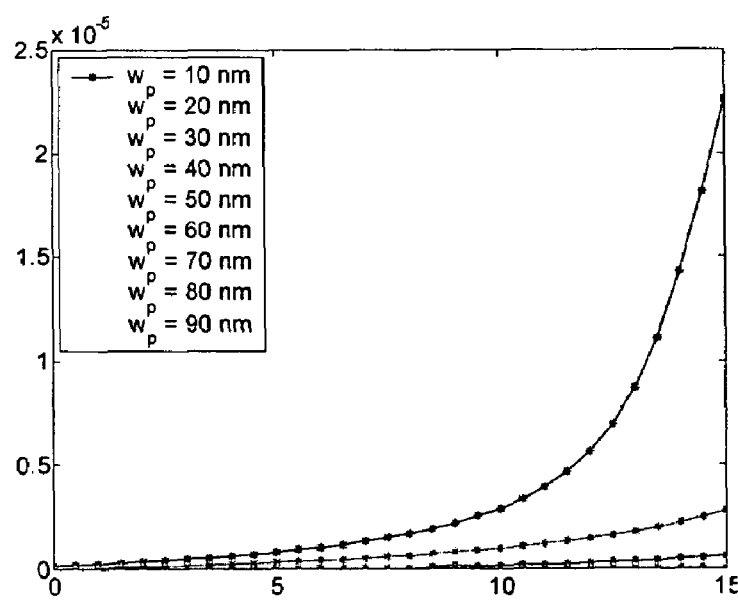
FIG. 6 is a graph showing a measure of a tunneling probability through a highly doped region for a QDAP.

Transport properties of QDAP 100 were studied by simulating a current-voltage (or I-V) characteristic of QDAP 100. FIG. 6 shows a current collected at the bottom contact 114 (which is a measure of a tunneling probability through highly-doped region 106) as a function of the applied bias voltage. The different curves correspond to different thicknesses of the highly doped region 106. The top most curve is for the thinnest barrier and the current decreases as the barrier thickness is increased. The tunneling probability increases with a decrease in a thickness of the highly doped region 106. In a preferred embodiment, an optimal thickness of highly doped region 106 is in the range approximately between 30-40 nm, and a preferred p-type doping level lies in the range approximately between $0.5 \times 10^{19}$-$1 \times 10^{19}$ cm$^{-3}$. There is a good amount of tolerance to the specified doping and thickness value, making the design robust to fluctuations during growth. Highly doped region 106 can include other thicknesses and other doping levels.

The performance of QDAP 100 can be further improved by use of heterostructures. For example, in a preferred embodiment, highly doped region 106 is GaAs. However, it is also possible to use a material such as Al$_x$Ga$_{1-x}$As ($0 \leq x \leq 1$). The use of heterostructures provides several advantages. It provides the ability to control a barrier by varying the composition of the AlGaAs layer while keeping the doping fixed. In addition, a barrier such as AlGaAs or the like serves to improve both the excess-noise and breakdown characteristics of the avalanche multiplier region. In particular, for a Geiger-mode design, used in photon counting applications, a thickness of an intrinsic region of a diode (such as avalanche multiplier region 104) can be decreased, thereby leading to a decrease in a value of an operating voltage, for example. The use of a heterostructure, e.g. by including In$_x$Al$_y$Ga$_{1-x-y}$As can also be used to control a band-offset of the structure.

Various changes and modifications to one or more of the embodiments herein chosen for purposes of illustration will readily occur to those skilled in the art. For example, the absorption region 110 can be based on quantum wells or other quantum-confined structures rather than quantum dots. Alternately, it can be based on non-quantum structures, for example impurity level detectors or other absorption regions based on intersubband transitions (i.e., the transition energy is less than the bandgap between the conduction and valence bands). These intersubband transitions generally lead to absorption at wavelengths at or longer than 2 μm. To the extent that such modifications and variations do not depart from the spirit of the invention, they are intended to be included within the scope thereof, which is assessed only by a fair interpretation of the following claims.

What is claimed is:

1. A photodetector comprising:
    a substrate;
    a semiconductor structure positioned on the substrate, the semiconductor substrate comprising:
        an avalanche multiplier region; and
        a highly doped p-type region positioned on the avalanche multiplier region; and
    an n-i-n structure positioned on the semiconductor structure, the n-i-n structure comprising:
        a first n-type contact region positioned on the highly doped p-type region;
        a quantum-confined absorption region positioned on the n-type contact region; and
        a second n-type contact region positioned on the quantum confined absorption region.

2. The photodetector of claim 1 wherein the semiconductor structure comprises:
    a p-i-n structure.

* * * * *